US006806453B1

(12) United States Patent
Vincent et al.

(10) Patent No.: US 6,806,453 B1
(45) Date of Patent: Oct. 19, 2004

(54) SCANNING, COPYING, AND PRINTING WITH REWRITABLE MEDIA

(75) Inventors: Kent D. Vincent, Cupertino, CA (US); Xia-An Zhang, Sunnyvale, CA (US); R. Stanley Williams, Redwood City, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 122 days.

(21) Appl. No.: 10/051,669

(22) Filed: Jan. 17, 2002

(51) Int. Cl.[7] .................................... H01L 27/00

(52) U.S. Cl. ................ 250/208.1; 250/234; 250/214 R; 235/472.01

(58) Field of Search ...................... 250/208.1, 234–236, 250/214 R; 235/472.01, 472.02, 472.03, 462.05

(56) References Cited

U.S. PATENT DOCUMENTS

| | | | | |
|---|---|---|---|---|
| 5,604,027 A | | 2/1997 | Sheridon | 428/323 |
| 5,825,044 A | | 10/1998 | Allen et al. | 250/557 |
| 6,124,851 A | | 9/2000 | Jacobson | 345/206 |
| 6,327,376 B1 | * | 12/2001 | Harkin | 382/124 |
| 6,429,422 B1 | * | 8/2002 | Bohn | 250/234 |
| 6,556,470 B1 | * | 4/2003 | Vincent et al. | 365/151 |
| 2002/0001032 A1 | * | 1/2002 | Ohki | 348/207 |
| 2003/0058765 A1 | * | 3/2003 | Schreurs et al. | 369/47.53 |
| 2003/0076343 A1 | * | 4/2003 | Fishkin et al. | 345/701 |

* cited by examiner

*Primary Examiner*—Diego Gutierrez
*Assistant Examiner*—Yaritza Guadalupe

(57) ABSTRACT

A scan-print device is hand-held and is scanned over the surface of a paper-like rewritable sheet. The sheet has a colorant responsive to a linear array of pixel-sized electric fields written over the sheet by the scan-print device during each scan, producing a bistable pixel (e.g., black or white) in response to field polarity. The bi-stable, rewritable colorant is highly energy efficient, requiring energy only to change an image, not to hold or illuminate it. Once a series of scans sufficient to cover the entire sheet has been made, the printed image appears as if printed conventionally. The print remains stable until reprinted or intentionally erased. Combined with hand-held scanner-copier technology, a portable copier is also implemented.

32 Claims, 4 Drawing Sheets

SCANNING, COPYING, AND PRINTING WITH REWRITABLE MEDIA

(2) CROSS-REFERENCE TO RELATED APPLICATIONS

Figure 1A:
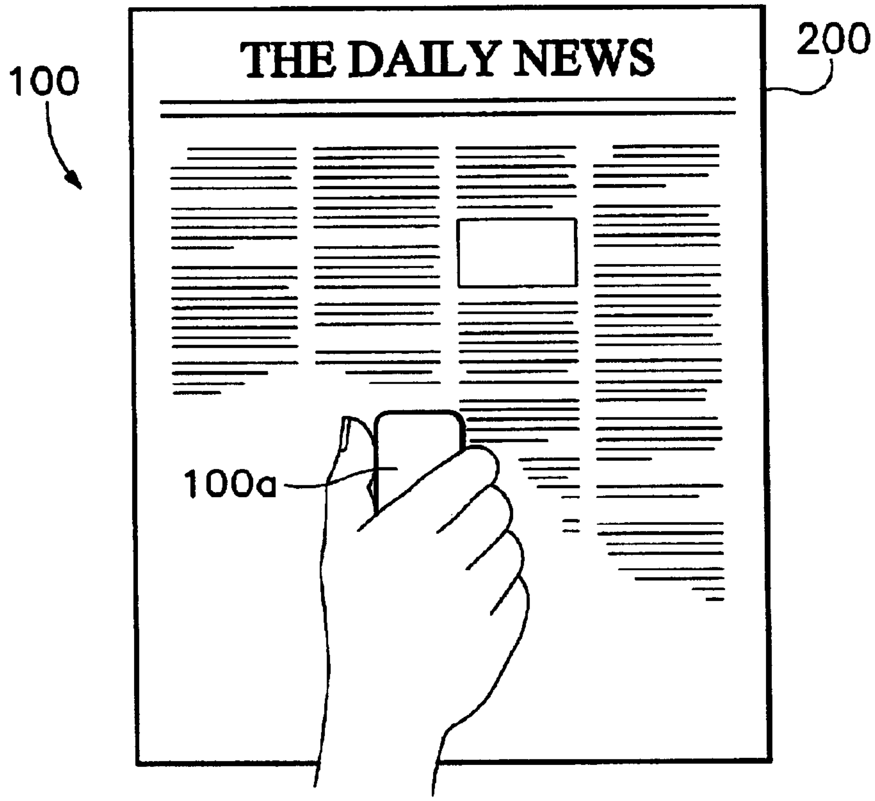

Not Applicable.

(3) STATEMENT REGARDING FEDERALLY SPONSORED RESEARCH OR DEVELOPMENT

Not Applicable.

(4) REFERENCE TO AN APPENDIX

The present application includes a hard copy appendix comprising pertinent specification pages and drawings of co-inventors' U.S. patent application Ser. No. 09/844,862, filed Apr. 27, 2001, by ZHANG et al. for MOLECULAR MECHANICAL DEVICES WITH A BAND GAP CHANGE ACTIVATED BY AN ELECTRIC FIELD FOR OPTICAL SWITCHING APPLICATIONS as relates to subject matter claimed in accordance with the embodiments of the present invention.

(5) BACKGROUND

(5.1) Field of Technology

The field of technology relates generally to scanning, copying, and printing.

(5.2) Description of Related art

Both the business community and the general public have adapted rapidly to global markets and mobile equipment for voice and data communications. In the state of the art, however, pocket-sized and briefcase-sized computer, computer accessory, and telecommunication appliances generally do not offer display resolution nor size needed to easily read standard documents, including electronic mail. For this reason, it is highly desirable to print documents for reading, preferably contemporaneously at any location in which the appliance is being used. Thus, with the increasing use of mobile computing and telecommunicating devices, there is a growing need for mobile printer apparatus and multifunctional devices that provide a combination of computer, telecommunications, and scanner-copier-printer functions.

Multi-pass scanning technology is fairly well developed. An array of sensors scans across a document swath-by-swath, collecting optical data, and storing the data digitally until the full length of a page is recorded. The data collected is transformed into a computer image file. Basically, a light source illuminates a thin horizontal strip, called a "raster line," of the document. The reflected light is captured by a charge-coupled device array and converted from an analog voltage to a digital value by an analog-to-digital (A/D) converter. In desktop scanners, digital data can be compiled sequentially in memory. For handheld scanners, because the array is not necessarily sequentially nor consistently moved across the document, computer algorithms (software, firmware) are provided for "stitching" the scanned pieces together based upon content analysis and comparison of scanned regions. As described in the Detailed Description of the embodiments of the present invention, such known manner handheld scanning and stitching processes can be used in accordance with the embodiments of the present invention. Highly advanced color technology for handheld scanning devices is also known in the art. U.S. Pat. No. 5,578,813 (1995), divisional U.S. Pat. No. 5,644,139 (1996), and divisional U.S. Pat. No. 5,825,044 (1998) by Allen et al. for a FREEHAND IMAGE SCANNING DEVICE WHICH COMPENSATES FOR NON-LINEAR COLOR MOVEMENT (collectively "the Allen patents"), are assigned to the common assignee herein and incorporated herein by reference in their entireties. Sophisticated hand motion navigation and data stitching is described in the above-referenced Allen patents.

In operation, the handheld scanners of the state of the art read a scanned document, converting the images into digital data which is stored in a memory. The stored data then must be transferred (generally through a computer microprocessor) to a compatible hard copy apparatus to obtain a print where, in an overall system view, only plain paper type print media generally is employed. Conventional printer technologies are not conducive to the use of mobile appliances. Ink, toner, and thermal-based technologies produce permanent print, but are not pocket-size compatible and require power in excess of adequate small cell battery operation.

Electrostatically polarized, bichromal particles for displays have been known since the early 1960's. The need for an electronic paper-like print medium has recently prompted development of at least two electrochromic picture element (pixel) colorants: (1) a microencapsulated electrophoretic colorant (see e.g., U.S. Pat. No. 6,124,851 (Jacobson) for an ELECTRONIC BOOK WITH MULTIPLE PAGE DISPLAYS, E Ink Corp., assignee), and (2) a field rotatable bichromal colorant sphere (e.g., the Xerox® Gyricon™). Each of these electrochromic colorants is approximately hemispherically bichromal, where one hemisphere of each microcapsule is made the display background color (e.g., white) while the second hemisphere is made the print or image color (e.g., black or dark blue). The colorants are field translated or rotated so the desired hemisphere color faces the observer at each pixel.

Figure 5A:
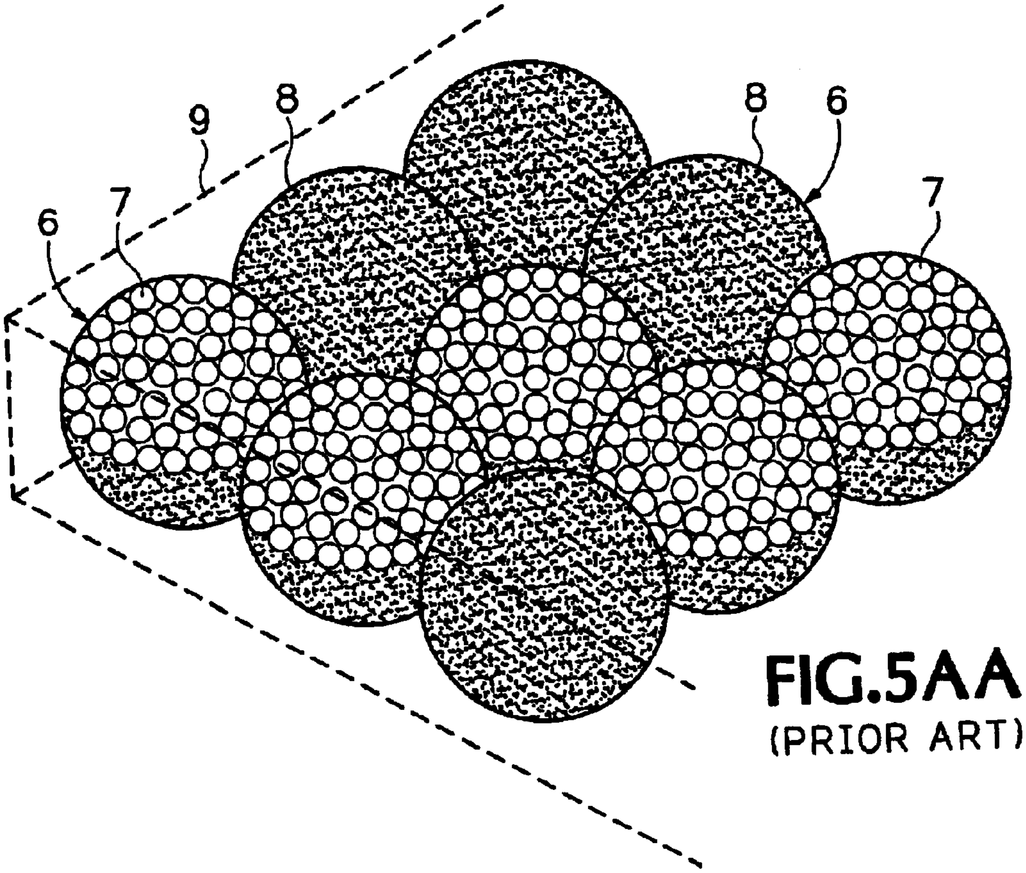
FIG.5AA (PRIOR ART)

FIGS. 5AA and 6AA schematically depict this type of prior art. Electronic ink is a recent development. As illustrated in FIG. 5AA (Prior Art), E Ink Corporation (Cambridge, Mass., www.eink.com) provides an electronic ink in a liquid form that can be coated onto a surface. Within the coating are tiny microcapsules (e.g., about 30 $\mu$m to 100 $\mu$m in diameter, viz. about as thick as a human hair, thus quite visible to the naked eye). Each microcapsule 6 has white particles 7 suspended in a dark dye 8. When an electric field is applied and sustained in a first polarity, the white particles move to one end of the microcapsule where they become visible; this makes the surface appear white at that spot. A carrier 9 is provided. An opposite polarity electric field pulls the particles to the other end of the microcapsules where they are substantially hidden by the dye; this makes the surface appear dark at that spot.

Figure 6A:
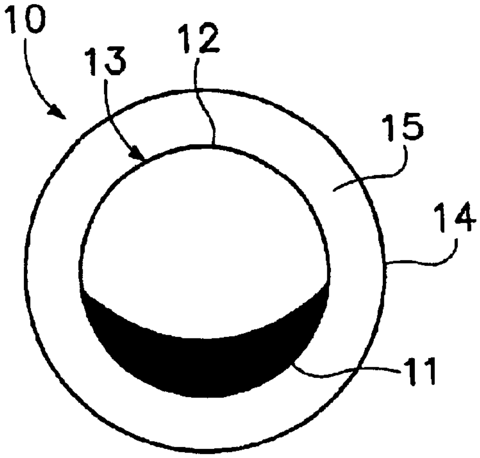
FIG.6AA (PRIOR ART)

The Xerox Gyricon sphere is described in several patents. FIG. 6AA (Prior Art) is a schematic illustration of this type of sphere. U.S. Pat. No. 4,126,854 (Sheridon '854) describes a bichromal sphere having colored hemispheres of differing Zeta potential that allow the spheres to rotate in a dielectric fluid under influence of an addressable electrical field. U.S. Pat. No. 4,143,103 (Sheridon '103) describes a display system using bichromal spheres in a transparent polymeric material. U.S. Pat. No. 5,604,027 (Sheridon '027), issued Feb. 18, 1997, for SOME USES OF MICROENCAPSULATION FOR ELECTRIC PAPER, describes a printer. Essentially, each sphere 10 (again, about 30 $\mu$m in diameter) has a bichromal ball 13 having two hemispheres 11, 12, typically one black and one white, each having different electrical properties. Each ball is enclosed within a spherical shell 14 and a space 15 between the ball and shell is filled with a liquid to form a microsphere so that the ball is free to rotate in response to an electrical field. The microspheres can be mixed into a substrate which can be formed into sheets or can be applied to a surface. The result is a film which can form an image from an applied and sustained electrical field. Currently, picture element ("pixel") resolution using this Gyricon spheres is limited to about 100 dpi.

To meet the needs of the highly mobile computing and telecommunicating public, there is a need for fully-portable, low power, handheld, scanning-copying-printing systems. Typically, a hard copy printed document will be read only once then discarded or saved for only a short period of time. Therefore, it is also highly desirable that the printed media be reusable so the user is not required to carry a large supply of paper while in mobile operation. Thus, there is a need for a systematic scanning-copying-printing and media system solution that is conducive to pocket-size compactness, battery operation, and media reuse.

(6) BRIEF SUMMARY

In a basic aspect there is provided a hard copy system including: rewritable media having a bistable, electrochromic, colorant susceptible to localized electrical fields; associated with said media, an electrode subsystem producing said localized electrical fields wherein said fields are associated with data to be printed; and affixed to said electrode subsystem, a scanning navigation subsystem for positioning said data on said media.

In another aspect there is provided a hard copy rendering method including: selectively providing localized electric fields, each of said fields conforming to a predetermined picture element size; portably transporting said fields across a printing medium such that a bistable electrochromic colorant of said medium is subjected to said electric fields; and manipulating said electric fields for producing printed data in said electrochromic colorant and rendering said hard copy in rewritable form.

In still another aspect there is provided a scanning printer including: a housing adapted for handheld use; and mounted within said housing, an electrode array fixedly aligned for printing data rasters, a navigation subsystem for tracking motion of said electrode array, a data port for transmitting data with respect to said data rasters, and connecting said array, subsystem and port, electronic circuitry associated with said tracking and said data rasters.

In another aspect there is provided a handheld copier system including: rewritable media having a bistable, electrochromic, colorant susceptible to localized electrical fields; and in a hand-held scannable housing, sensor means for generating image signals representative of an image as said sensor means is scanned across the image, and in a fixed position relative to said sensor means, navigation means for forming at least one position signal indicative of inherent structure related properties correlated to said image signals as said sensor means is scanned, and connected to said sensor means, processor means for processing said image signals and position signals, connected to said processor means, memory means for storing image signals and position signals, and connected to processor means, electrode means for producing said localized electrical fields wherein said fields are associated with said image signals and said positions signals for printing a copy of said image on said rewritable media.

In another aspect there is provided a method for scanning and printing, the method including: scanning a document with a self-contained, hand held, scanning and printing apparatus; and printing data collected during said scanning on a rewritable medium with said apparatus such that said document is reproduced on said medium.

The foregoing summary is not intended to be an inclusive list of all the aspects, objects, advantages and features of the embodiments of the present invention nor should any limitation on the scope of the invention be implied therefrom. This Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches. Other objects, features and advantages of the embodiments of the present invention will become apparent upon consideration of the following explanation and the accompanying drawings, in which like reference designations represent like features throughout the drawings.

(7) BRIEF DESCRIPTION OF THE DRAWINGS

In accordance with 37 C.F.R. 1.84(u), in order to prevent confusion with FIGURES of the Appendix hereto, the drawings of this application use double capital letter suffices.

FIG. 1AA is a schematic overview of a handheld scanning system in accordance with an embodiment of the present invention.

Figure 1B:
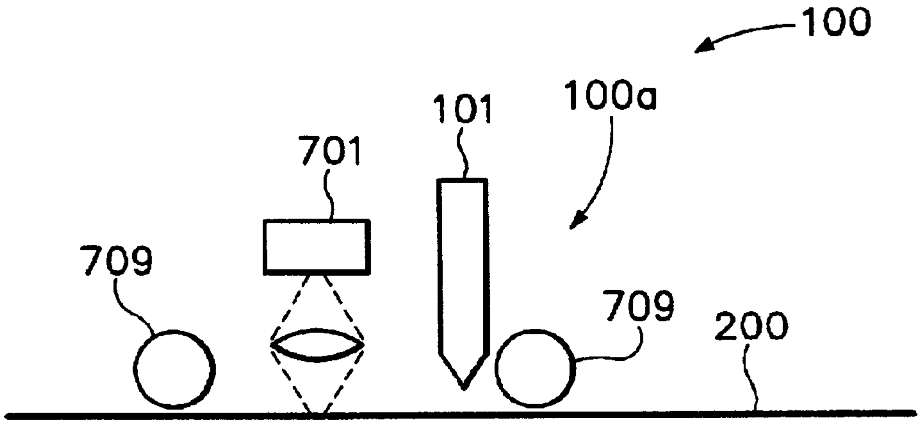

FIG. 1BB is a schematic, elevation view, block diagram of the scan-print system in accordance with the embodiment of the present invention as shown in FIG. 1AA.

Figure 1C:
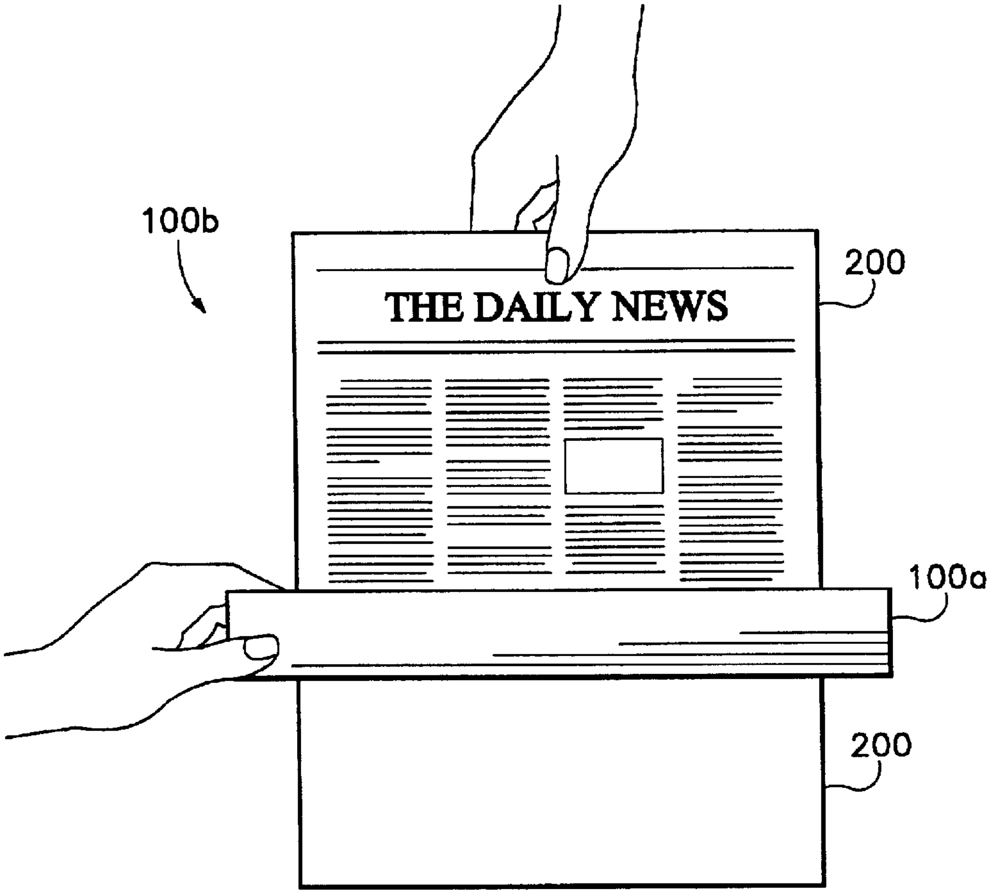

FIG. 1CC is an alternative embodiment of the present invention as shown in FIG. 1AA.

Figure 2A:
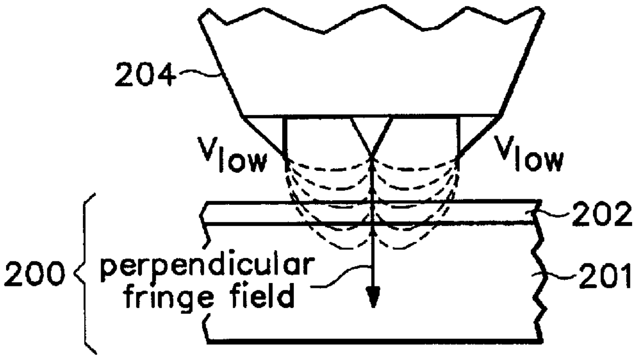

FIG. 2AA is a schematic depiction of a parallel fringe field printhead of an electrode array of the system as shown in FIG. 1AA.

Figure 2B:
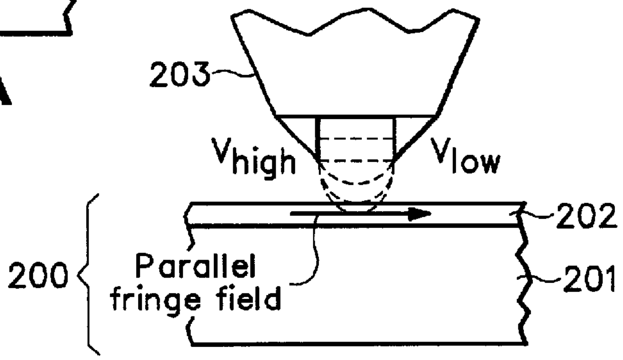

FIG. 2BB is a schematic depiction of a perpendicular fringe field printhead of an electrode array of the system as shown in FIG. 1AA.

Figure 3A:
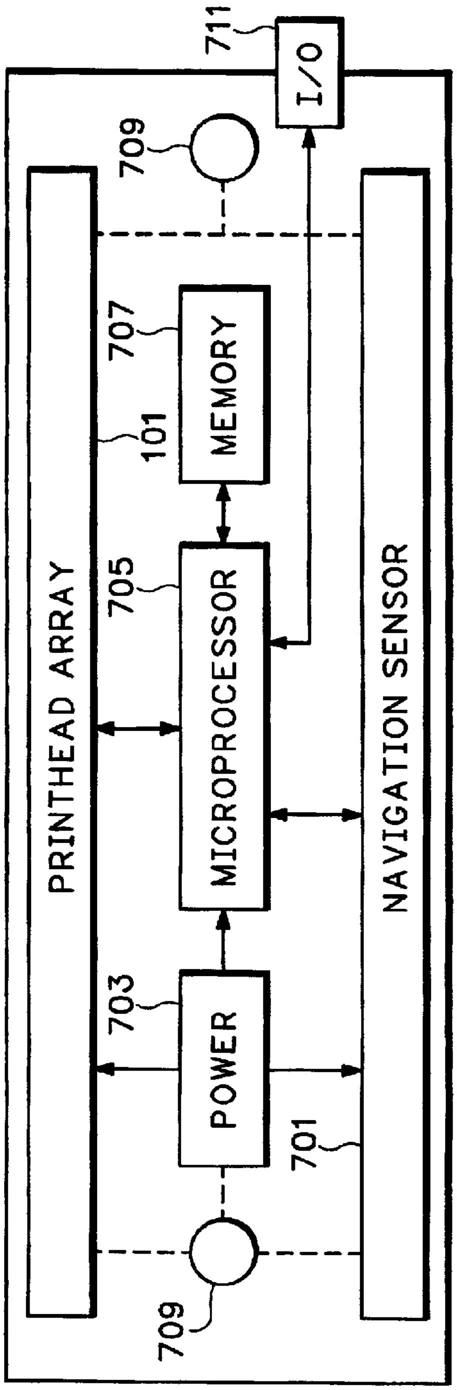

FIG. 3AA is a block diagram of a scanning printer of the system of the embodiments of the present invention as shown in FIGS. 1AA and 1CC.

Figure 4A:
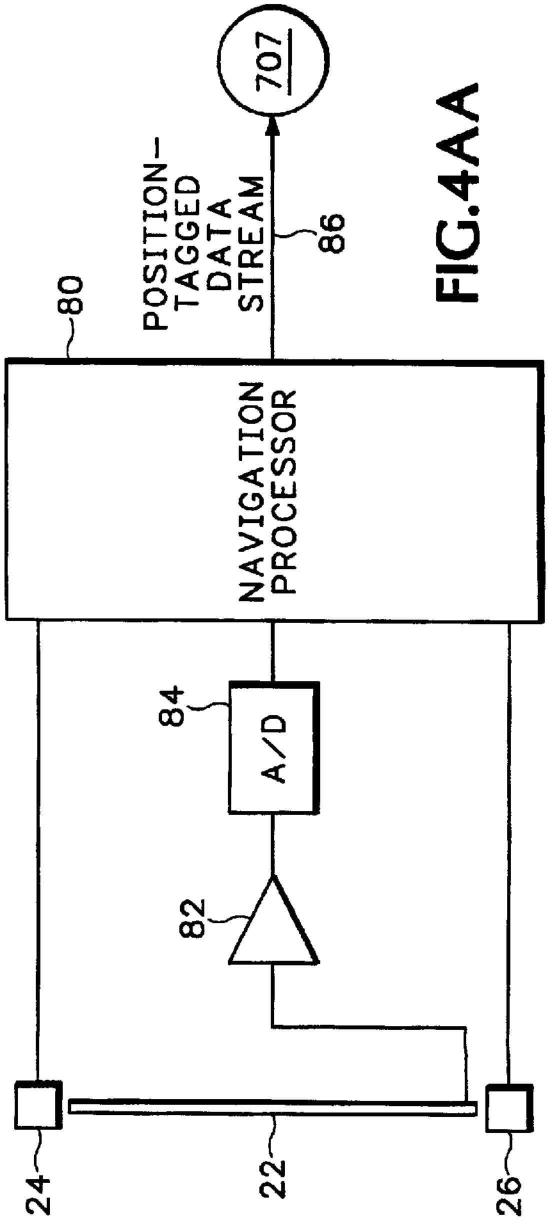

FIG. 4AA is an alternative embodiment of the present invention as shown in FIG. 3AA for adding specific elements related to handheld copying functionality.

FIG. 5AA (Prior Art) is an exemplary electronic ink device.

FIG. 6AA (Prior Art) is a schematic depiction of a Xerox Gyricon sphere.

The drawings referred to in this specification should be understood as not being drawn to scale except if specifically annotated.

(8) DETAILED DESCRIPTION

Definitions

The following terms and ideas are applicable to both the present discussion and the Appendix hereto.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bistable" as applied to a molecule means a molecule having two relatively low energy states (local minima) separated by an energy (or activation) barrier. The molecule may be either irreversibly switched from one state to the other (singly configurable) or reversibly switched from one state to the other (reconfigurable). The term "multi-stable" refers to a molecule with more than two such low energy states, or local minima.

The term "bi-modal" for colorant molecules in accordance with the embodiments of the present invention may be designed to include the case of no, or low, activation barrier for fast but volatile switching. In this latter situation, bistability is not required, and the molecule is switched into one state by the electric field and relaxes back into its original state upon removal of the field; such molecules are referred to as "bi-modal". In effect, these forms of the bi-modal colorant molecules are "self-erasing". In contrast, in bistable colorant molecules the colorant molecule remains latched in its state upon removal of the field (non-volatile switch), and the presence of the activation barrier in that case requires application of an opposite field to switch the molecule back to its previous state. Also, "molecular colorant" as used hereinafter as one term to describe aspects of the embodiments of the present invention is to be distinguished from other chemical formulations, such as dyes, which act on a molecular level; in other words, "molecular colorant" used hereinafter signifies that the colorant molecules as described in the Appendix and their equivalents are employed in accordance with the embodiments of the present invention.

Micron-scale dimensions refers to dimensions that range from 1 micrometer to a few micrometers in size.

Submicron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference between the HOMO and LUMO and other energetically nearby molecular orbitals is responsible for the color of the molecule.

An "optical switch," in the context of the embodiments of the present invention, involves changes in the electromagnetic properties of the molecules, both within and outside that detectable by the human eye, e.g., ranging from the far infra-red (IR) to deep ultraviolet (UV). Optical switching includes changes in properties such as absorption, reflection, refraction, diffraction, and diffuse scattering of electromagnetic radiation.

The term "transparency" is defined within the visible spectrum to mean that optically, light passing through the colorant is not impeded or altered except in the region in which the colorant spectrally absorbs. For example, if the molecular colorant does not absorb in the visible spectrum, then the colorant will appear to have water clear transparency.

The term "omni-ambient illumination viewability" is defined herein as the viewability under any ambient illumination condition to which the eye is responsive.

As a general proposition, "media" in the context of the embodiments of the present invention includes any surface, whether portable or fixed, that contains or is layered with a molecular colorant or a coating containing molecular colorant in accordance with the embodiments of the present invention wherein "bistable" molecules are employed; for example, both a flexible sheet exhibiting all the characteristics of a piece of paper and a writable surface of an appliance (be it a refrigerator door or a computing appliance using the molecular colorant). "Display" (or "screen") in the context of the embodiments of the present invention includes any apparatus that employs "bi-modal" molecules, but not necessarily bistable molecules. Because of the blurred line regarding where media type devices ends and display mechanisms begin, no limitation on the scope of the invention is intended nor should be implied from a designation of any particular embodiment as a "media" or as a "display."

As will become apparent from reading the Detailed Description and Appendix, "molecule" can be interpreted in accordance with the embodiments of the present invention to mean a solitary molecular device, e.g., an optical switch, or, depending on the context, may be a vast array of molecular-level devices, e.g., an array of individually addressable, pixelsized, optical switches, which are in fact linked covalently as a single molecule in a self-assembling implementation. Thus, it can be recognized that some molecular systems comprise a super-molecule where selective domain changes of individual molecular devices forming the system are available. The term "molecular system" as used herein refers to both solitary molecular devices used systematically, such as in a regular array pixel pattern, and molecularly linked individual devices. No limitation on the scope of the invention is intended by interchangeably using these terms nor should any be implied.

Reference is made now in detail to embodiments of the present invention, which illustrates the best mode presently contemplated for practicing the invention. Alternative embodiments are also briefly described as applicable. More particularly embodiments of the present invention are described for a scanning-copying-printing apparatus adapted for use with rewritable media, and specifically to a system including a portable, hand-held, scanning printer using a rewritable print medium having a bistable, bi-modal molecular colorant layer.

Referring to FIGS. 1AA, 1BB, and 1CC, the system 100 includes a self-contained, handheld, scanning-copying-printing apparatus (hereinafter referred to as the "scan-print device" 100*a* or 100*b*) associated with and designed to print on a rewritable media sheet 200.

Specifically, the rewritable media sheet 200 comprises a field addressable rewritable media. Referring also to FIGS. 2AA and 2BB, the rewritable media sheet 200 has a substrate 201 (preferably a flexible material providing a haptic resemblance to plain paper) and a molecular colorant layer 202. The electrochromic molecular colorant coating 202 layer (on the order of a few microns) contains bi-modal, bistable, electrochromic molecules that undergo conformational changes as a result of application of an electric field that in effect changes selectively localized regions of this coating from one hue to another. This can be thought of as millions of molecular switching devices per cubic micron of colorant. The Appendix hereto describes features of the molecular colorant of the media. For describing the embodiments of the present invention, the preferred molecular colorant embodiment will be used; however, it will be recognized by those skilled in the art that the device 100*a*, 100*b* can be adapted to work with an electronic print media employing E Ink or Xerox microsphere devices. The end-user may carry more than one sheet of the rewritable media 200 so that a multi-page print can be rendered or so that the printed copy can be retained for a period of time while other prints are also rendered. Moreover, each sheet can also be two-sided by having a colorant layer on each side of the substrate, appropriately electrically isolating each colorant layer.

The elements of the scan-print device 100*a*, 100*b* are shown schematically in FIG. 1BB, and details thereof in FIGS. 2AA, 2BB. While a palm-fit, scan-print device 100*a* is shown in FIG. 1AA, it is to be recognized that a scan-print device in accordance with the embodiments of the present invention can be implemented in a variety of shapes and sizes. For example, some end-users might prefer a briefcase-sized implementation having a one-stroke, full-page (e.g., A-size) scan-printing capability, illustrated as an alternative embodiment in FIG. 1CC as system 100*b*. Both FIGS. 1AA and 1CC show the system 100 in the printing mode with partially printed pages. Scanning is a similar running of the scan-print device 100*a* over the original document in a scanning mode to collect the data using known manner techniques as in, e.g., the Allen patents.

Generally in accordance with the embodiments of the present invention, the scan-print device 100*a* includes (1) an electrode printhead array 101, (2) a media navigation sensor (s) 701 to determine substantially instantaneous position and orientation of each printhead of the array 101 relative to the media sheet 200 during scanning-printing, and (3) an associated operational electronics package and input-output ("I/O") port, or more simply "circuitry," 703, 705, 707, 711 for position and data processing, including to store, sequence and print images on the media sheet. These components of the scan-print device 100*a* are commonly housed such that the hand-held device is easily scanned over the surface of the rewritable sheet 200 to compose a printed image, e.g., as partially printed in the exemplified printing mode illustration of FIGS. 1AA and 1CC. To facilitate motion over the media 200, rolling-spacing devices 709 can be provided. The I/O port 711 can be for wired or wireless (e.g., infrared, "IR") communication as would be known in the state of the art.

The printhead 101 includes an electrode array of individual electrodes 204, 203 as demonstrated by either FIG. 2AA or 2BB, respectively. The printhead 101 can comprise a palm-size device linear array (for an implementation embodiment similar to FIG. 1AA), a sheet-wide linear array (for an implementation embodiment similar to FIG. 6AA), or an equivalent staggered array of electrodes 204, 203 in contact or near contact with the media 200 surface. Electrode arrays and drive electronics are common to electrostatic printers and their constructions and interfaces are well known. For example, Sheridon in U.S. Pat. No. 5,389,945, Feb. 14, 1995, describes an electrode array printer for printing on re-writable paper. Each is sized, positioned, and electrically addressed in a known manner to provide an appropriate electric field to the colorant layer 202 at each given pixel location (or superset of pixels) along a pixel column (or columns if a staggered array) of the rewritable medium 200.

Exemplary "fringe field" electrodes are depicted in FIGS. 2AA and 2BB. The electrical field may be oriented perpendicular to the plane of the print medium 200 as in FIG. 2AA or parallel to it as in FIG. 2BB. In the exemplary embodiment, a common electrode, or set of electrodes 204, 203, is placed adjacent to the medium 105 virtual pixel array so that printing is accomplished by passage of fringe fields through the colorant 202. The fringe field is illustrated by dashed-lines labeled "$V_{high}$" and "$V_{low}$". The field is concentrated under the electrode tip and the return field is dispersed and therefor does not effect the colorant layer. Fringe field imaging is advantageous since the electric field is not significantly influenced by the physical structure of the substrate.

The printhead array 101 can be fabricated in accordance with known manner integrated circuit and thin film technologies, thereby providing an electrode array of individual printheads 204, 203 in combination with the molecular colorant 202 of the medium 200 having the ability to produce a pixel resolution at least equivalent to the best commercial printers, e.g., 1200 dots per inch in the current state of the art. Importantly, such electrode arrays can be low powered, requiring only a lightweight battery.

In operation, the media navigation sensor 701 and associated circuitry optically monitor an associated medium's relative coordinates and angular orientation of the array 101 to the surface of the rewritable sheet 200 during a given scan. See e.g., Allen et al., supra. Print pulses are given to each array 101 element 204, 203 in coordination with its passage over a given image picture element ("pixel") location of a rectilinear pixel grid imposed (virtually) on the rewritable media sheet 200. The pulses sequentially generate a black pixel for each print data point or data set representing a pixel or super-pixel (or other high contrast color preferred by the end-user) or a white pixel (or transparent molecular state over a contrasting color substrate 202; see also Appendix hereinafter) where there is no data point.

As an optional function, a feature can be incorporated whereby the entire electrode array 101 is set with a polarity that erases the molecular colorant, viz., changes the molecules state to white or transparent. A simple ERASE actuator button can be provided on the housing to activate the scan-print device 100*a* and deactivate the navigational subsystem 701 so that a simple waving of the device across the surface randomly "erases" the image in the same manner as a conventional pencil or chalkboard eraser does. This provides an added security feature for documents having sensitive information which the user does not want to inadvertently disclose to unauthorized persons.

However, because the molecular colorant 202 in the rewritable sheet 200 may be overwritten with the same drive pulse without changing its pixel value, the printed image does not need to be conventionally "stitched" together. In other words, successive scans of the electrode array 101 over the same pixel or pixel area does not change the color of the pixel provided that the field oriented by each electrode is of the same polarity with each scan. Thus, the scanner does not need to remember where it has printed and where it has not in the manner that a conventional hand-scanner transmitting data to a conventional printer (e.g., ink-jet) would to establish a grid memory to assure that multiple dots on successive (redundant or overlap) passes does not occur. This allows the user to print in overlapping scans without disrupting the image.

As shown in FIG. 3AA, for data processing, embodiments of the present invention use circuitry 703–711 common to conventional, known manner, computer interfaced printers for data manipulation. Known manner associated electronic circuitry, such as a microprocessor 705 and associated software, or firmware, to download, store, sequence and print alphanumeric text and images (or e.g. an application specific integrated circuit, ASIC, with appropriate buffers) and memory 707 can be employed. Battery power 703 is preferred. Note also, that electrical generator circuitry devices can be associated with the print surface navigation roller-spacing devices 709 to generate the electric fields. In an alternative, less portable embodiment, the scan-print device 100*b* may be directly interfaced (e.g. direct line connection, radio, or IR) to a computer (not shown) for scanning-copying-printing or may print pre-downloaded images from such a computer to the on-board memory 707.

The scan-print device 100*a* is not only suited for applications involving the printing of standard documents, but is also well suited for the printing of labels and posters. For example, the scan-print device 100 a may be used to update price tags on retail (e.g. grocery) store shelves. The price tag in this instance comprises an adapted implementation of the rewritable media 200 of the embodiments of the present invention. In these implementations, the scan-print device 100*a* can be coupled to a small computer in which data is entered for printing as described above. The scan-print device 100*a* is scanned across the rewritable tag to make each image. As another example, chemical glassware may likewise include a durable, rewritable, contents label of the media 200 in accordance with the embodiments of the present invention that may be electrostatically rewritten with each cleaning and reuse of the glassware.

Thus in the preferred embodiment, the present invention provides a scan-print device 100*a* that is hand held and is scanned over the surface of a (a paper-like rewritable sheet 200. The sheet 200 is responsive to a linear array of pixel-sized electric fields written over the sheet by the scan-print device 100*a* during each scan, producing a bistable black or white pixel in response to field polarity. The bi-stable, rewritable colorant is highly energy efficient, requiring energy only to change an image, not to hold or illuminate it. Once a series of scans sufficient to cover the entire sheet has been made, the printed image appears as if printed conventionally. The print remains stable until reprinted or intentionally erased.

As illustrated by FIG. 4AA (see also U.S. Pat. No. 5,825,044, supra, FIG. 9), adding prior art optical scanning to the embodiments of the present invention printer-rewritable media combination, is another alternative. Thus, these implementations of the present invention include handheld copier embodiments. In one embodiment, pixel values from the two navigation sensors 24 and 26 are received by a navigation processor 80. The pixel-by-pixel image signal generated at a known manner optical imaging sensor 22 is output via a known manner pixel amplifier 82 and analog-digital converter 84. The image signal is position-tagged based upon the navigation data and output as described in detail in the Allen '044 patent; shown as "POSITION-TAGGED DATA STREAM" 86. Position-tagged data can then be stored in memory 707, FIG. 3AA. The position tagged data can then be printed on the rewritable media 200 as described with respect to previous FIGURES hereinabove. Appropriate known manner controls, e.g., function buttons (not shown) are provided in accordance with the state of the art.

Operation of this handheld copier embodiment is as simple as using a handheld scanner such as described in the Allen patents. With respect to an original image, the user puts the apparatus into a SCANNING MODE and collects the original image data, e.g., running the scanner across the page of a book. The user then puts the apparatus into a PRINTING MODE and prints the data onto a sheet of the rewritable media.

Note that an ERASE MODE can be easily implemented by providing a signal from the processor which drives the electrode array to align all of the molecules to either one state, e.g., all black. Moreover, conventional electronics may be incorporated for contrast alteration, image scaling, duplexing on a sheet, and the like can be incorporated.

The advantages provided the embodiments of the present invention over the state of the art scanning-printing-copying technology are substantially limitless. A user can take the system 100 to any original document or image and immediately render an erasable copy. As the molecular colorant is substantially permanently stable in the absence of an applied field as shown in FIGS. 2AA and 2BB, the sheet can be then conventionally copied for distribution, sent over a facsimile apparatus, or the like.

The foregoing description of embodiments of the present invention have been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. These embodiments were chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . " and no process step herein is to be construed under those provisions unless the step or steps are expressly recited using the phrase "comprising the step(s) of . . . "

What is claimed is:

1. A hard copy system comprising:

rewritable medium having a bistable, electrochromic, colorant susceptible to localized electrical fields;

associated with said medium, an electrode subsystem producing said localized electrical fields wherein said fields are associated with data to be printed; and affixed to said electrode subsystem, a scanning navigation subsystem for positioning said data on said medium.

2. The system as set forth in claim 1, said electrochromic colorant further comprising:

at least one layer of a molecular colorant coating wherein molecules of the coating are at least bichromal and subjectable to bistable switching between color states under influence of said localized electric fields.

3. The system as set forth in claim 2 comprising:

said molecules exhibit an electric field induced band gap change, occurring via a mechanism selected from a group including (1) molecular conformation change or an isomerization, (2) change of extended conjugation via chemical bonding change, and (3) molecular folding or stretching.

4. The system as set forth in claim 1, said electrode subsystem and navigation subsystem further comprising:

means for downloading, storing, sequencing, and printing text and images.

5. The system as set forth in claim 1 wherein said electrode subsystem and navigation subsystem are configured as a portable, hand-held, hard copy apparatus.

6. The system as set forth in claim 1 further comprising:

means for scanning an original document and for providing a data set representative of said original document as said data to be printed.

7. The system as set forth in claim 1 wherein said electrode subsystem and navigation subsystem are housed in a palm-sized device.

8. The system as set forth in claim 1 wherein said electrode subsystem and navigation subsystem are configured as a hand-held page wide electrode array device.

9. The system as set forth in claim 1 comprising:

said colorant layer incorporates at least one layer of a first plurality of microcapsules having bichromal, bistable colorant within the microcapsules.

10. The system as set forth in claim 1 comprising:

said medium has a said colorant layer on each printing surface thereof.

11. A hard copy rendering method comprising:

selectively providing localized electric fields, each of said fields conforming to a predetermined picture element size;

transporting said fields across a printing medium such that a bistable electrochromic colorant layer of said medium is subjected to said electric fields; and manipulating said electric fields for producing printed data in said electrochromic colorant layer and rendering said hard copy in rewritable form.

12. The method as set forth in claim 11 wherein a first polarity of said localized electric fields prints a picture element.

13. The method as set forth in claim 12 wherein a reverse polarity of said first polarity of said localized electric fields erases a picture element.

14. The method as set forth in claim 11 in a portable, hand-held scan-print system.

15. The method as set forth in claim 11 wherein said electrochromic colorant layer is at least one layer of a molecular colorant coating wherein molecules of the coating are at least bichromal and subjectable to bistable switching between color states under influence of said localized electric field.

16. The method as set forth in claim 15 wherein said molecules exhibit an electric field induced band gap change, occurring via a mechanism selected from a group including (1) molecular conformation change or an isomerization, (2) change of extended conjugation via chemical bonding change, and (3) molecular folding or stretching.

17. The method as set forth in claim 11 wherein said colorant layer incorporates at least one layer of a plurality of microcapsules having bichromal, bistable colorant within the microcapsules.

18. The method as set forth in claim 11 comprising:

providing a hand held apparatus for rendering the hard copy;

in said hand held apparatus, further providing means for scanning an image and a converting said image to a data set such that said data set is said printed data.

19. The method as set forth in claim 18 comprising:

prior to printing the image, manipulating said data set for altering size of said image on the hard copy.

20. The method as set forth in claim 18 comprising:

prior to printing the image, manipulating said data set for altering the appearance of said image on the hard copy.

21. A scanning printer comprising:

a housing adapted for handheld use; and mounted within said housing, an electrode array fixedly aligned for printing data rasters, said electrode array providing localized pixel-sized electrical fields and acting as a plurality of tuned printheads such that said printheads are tuned for association with molecular colorant print media, wherein said molecular colorant print media has a substrate and at least one layer of electrochromic molecular colorant on a printing surface of said substrate, wherein molecules of the coating are at least bichromal and subjectable to bistable switching between color states under influence of said electric field, a navigation subsystem for tracking motion of said electrode array, a data port for transmitting data with respect to said data rasters, and connecting said array, subsystem and port, electronic circuitry associated with said tracking and said data rasters.

22. The apparatus as set forth in claim 21 wherein said molecules exhibit an electric field induced band gap change, occurring via a mechanism selected from a group including (1) molecular conformation change or an isomerization, (2) change of extended conjugation via chemical bonding change, and (3) molecular folding or stretching.

23. The apparatus as set forth in claim 21 further comprising:

sensors for generating image signals representative of an image as said sensors are scanned across the image, and in a fixed position relative to said sensors, navigation devices for forming at least one position signal indicative of inherent structure related properties correlated to said image signals as said sensors are scanned, a data processor connected to said sensors for processing said image signals and position signals, and a memory connected to said processor for storing image signals and position signals as said data rasters.

24. A handheld copier system comprising:

rewritable media having a bistable, electrochromic, colorant layer susceptible to localized electrical fields; and in a hand-held scannable housing, sensor means for generating image signals representative of an image as said sensor means is scanned across the image, and in a fixed position relative to said sensor means, navigation means for forming at least one position signal indicative of inherent structure related properties correlated to said image signals as said sensor means is scanned, and connected to said sensor means, processor means for processing said image signals and position signals, connected to said processor means, memory means for storing image signals and position signals, and connected to processor means, electrode means for producing said localized electrical fields wherein said fields are associated with said image signals and said positions signals for printing a copy of said image on said rewritable media.

25. The system as set forth in claim 24, said navigation means further comprising:

connected to said electrode subsystem, electrical generating means for producing said localized electrical fields.

26. The system as set forth in claim 24 said electrochromic colorant layer further comprises:

at least one layer of a molecular colorant coating wherein molecules of the coating are at least bichromal and subjectable to bistable switching between color states under influence of said localized electrical field.

27. The system as set forth in claim 26 comprising:

said molecules exhibit an electric field induced band gap change, occurring via a mechanism selected from a group including (1) molecular conformation change or an isomerization, (2) change of extended conjugation via chemical bonding change, and (3) molecular folding or stretching.

28. The system as set forth in claim 26, the molecular colorant coating further comprising:

a mosaic pixel pattern of primary color pixels such that full color printing is produced by said electrode subsystem on said media.

29. A method for scanning and printing, the method comprising:

scanning a document with a self-contained, hand held, scanning and printing apparatus; and printing data collected during said scanning on a rewritable medium with said apparatus such that said document is reproduced on said medium.

30. The method as set forth in claim 29 wherein said rewritable medium is a rewritable medium having a bistable, electrochromic, colorant susceptible to localized electrical fields.

31. The method as set forth in claim 30 wherein said colorant is at least one layer of a molecular colorant coating wherein molecules of the coating are at least bichromal and subjectable to bistable switching between color states under influence of said localized electrical fields.

32. A method of manufacture of a hand held scanning and printing apparatus, the method comprising:

in a hand held scanner device, aligning an array of electrodes for producing localized electrical fields for manipulating a bistable, electrochromic, molecular colorant on a rewritable medium; and tuning said fields such that molecules of the colorant are subjectable to bistable switching between color states under influence of said fields such that data captured by said device is printable on said medium.

* * * * *